United States Patent [19]

Yagi et al.

[11] Patent Number: 4,968,765

[45] Date of Patent: Nov. 6, 1990

[54] MOLECULARLY ORIENTED MOLDED BODY OF ULTRA-HIGH-MOLECULAR-WEIGHT ETHYLENE/POLYENE COPOLYMER

[75] Inventors: Kazuo Yagi, Ohtake; Akinori Toyota, Iwakuni, both of Japan

[73] Assignee: Mitsui Petrochemical Industries, Ltd., Tokyo, Japan

[21] Appl. No.: 239,685

[22] Filed: Sep. 2, 1988

[30] Foreign Application Priority Data

Sep. 5, 1987 [JP] Japan .................................. 62-221213

[51] Int. Cl.$^5$ ............................................ C08F 236/20
[52] U.S. Cl. ..................................... 526/336; 526/339; 526/348.1; 524/487; 524/490; 524/570; 524/579; 428/364; 428/902
[58] Field of Search ...................... 526/336, 348.1, 339; 428/364, 902; 524/487, 490, 570, 579

[56] References Cited

U.S. PATENT DOCUMENTS 3,190,862  6/1965  Boghetich et al. .................. 526/336
4,259,468  3/1981  Kajiura et al. .................... 526/336 X
4,545,950  10/1985  Motooka et al. .......... 264/331.17 X

FOREIGN PATENT DOCUMENTS 0219166  4/1987  European Pat. Off. ............ 526/336

OTHER PUBLICATIONS

Schwartz, Plastics Materials and Processes, Van Nostrand Reinhold, N.Y., N.Y., 1982, p. 74.
Hug, UHMW polyethylene, Mod. Plas. Encyclopedia, McGraw-Hill, Inc., N.Y., 66 (1980).

*Primary Examiner*—Joseph L. Schofer
*Assistant Examiner*—F. M. Teskin
*Attorney, Agent, or Firm*—Sherman and Shalloway

[57] ABSTRACT

Disclosed is a molecularly oriented molded body of an ultra-high-molecular-weight ethylene/polyene copolymer having an intrinsic viscosity ($\eta$) of at least 5 dl/g and such a content of a polyene that the number of molecules of the polyene is 0.01 to 15 on the average per 1000 carbon atoms, wherein the molded body shows at least two crystal fusion endothermic peaks when the measurement is conducted in the restraint state by using a differential scanning calorimeter, the molded body has at least one crystal fusion endothermic peak (Tp) at a temperature higher by at least 20° C. than the inherent crystal fusion temperature (Tm) of the ultra-high-molecular-weight ethylene/polyene copolymer determined as the main fusion endothermic peak at the time of the second elevation of the temperature, and the quantity of heat based on said crystal fusion endothermic peak (Tp) is at least 15% based on the total fusion heat quantity.

11 Claims, 7 Drawing Sheets

MOLECULARLY ORIENTED MOLDED BODY OF ULTRA-HIGH-MOLECULAR-WEIGHT ETHYLENE/POLYENE COPOLYMER

BACKGROUND OF THE INVENTION

1. Field of the Invention

The present invention relates to a molecularly oriented molded body of an ultra-high-molecular-weight ethylene/polyene copolymer. More particularly, the present invention relates to a molecularly oriented molded body, especially a fiber, of an ultra-high-molecular-weight ethylene/polyene copolymer, which has novel crystal fusion characteristics and is excellent in mechanical properties, heat resistance and creep resistance. 2. Description of the Prior Art It is known that a molecularly oriented molded body having high elastic modulus and high tensile strength is prepared by molding ultra-high-molecular-weight polyethylene into a fiber, a tape or the like and drawing the molded product. For example, Japanese Patent Application Laid-Open Specification No. 15408/81 discloses a process comprising spinning a dilute solution of ultra-high-molecular-weight polyethylene and drawing the obtained filaments. Furthermore, Japanese Patent Application Laid-Open Specification No. 130313/84 discloses a process comprising melt-kneading ultra-high-molecular-weight polyethylene with a wax, extruding the kneaded mixture, cooling and solidifying the extrudate and drawing the solidified extrudate. Moreover, Japanese Patent Application Laid-Open Specification No. 87614/84 discloses a process comprising extruding the above-mentioned melt-kneaded mixture, drafting the extrudate, then cooling and solidifying the extrudate and drawing the solidified extrudate.

When ultra-high-molecular-weight polyethylene is molded into the form of a fiber and the fiber is strongly drawn, the elastic modulus and tensile strength are increased with increase of the draw ratio, and the obtained fiber has such excellent mechanical properties as high elastic modulus and high tensile strength and are excellent in the light weight characteristic, water resistance and weatherability. However, the heat resistance is inevitably restricted because the melting point of polyethylene is relatively low and generally in the range of from 120° to 140° C. Furthermore, when a fiber of ultra-high-molecular-weight polyethylene is used at a high temperature, the strength retention ratio is drastically reduced and the creep is extraordinarily increased.

SUMMARY OF THE INVENTION

It is therefore a primary object of the present invention to provide a molecularly oriented molded body of the ultra-high-molecular-weight polyethylene type, which has novel crystal fusion characteristics and is highly improved in heat resistance and creep resistance.

Another object of the present invention is to provide a molecularly oriented molded body of the ultra-high-molecular-weight polyethylene type, which shows very high strength retention ratio and elastic modulus retention ratio even when the molded body is subjected to a high-temperature heat history, for example, a heat treatment conducted at 170°C. for 5 minutes, and in which the creep is controlled to a very low level at a high temperature.

We found that when an ultra-high-molecular-weight ethylene/polyene copolymer formed by copolymerizing ethylene with a specific small amount of a polyene is extrusion-molded and drawn, the copolymer shows a much better drawability than the ordinary ultra-high-molecular-weight ethylene homopolymer and an effective molecular orientation can be given by drawing at a high draw ratio, there is obtained a novel molecularly oriented molded body showing a phenomenon of elevation of the fusion temperature, not observed in the conventional polyethylene draw-molded bodies, and that this molecularly oriented molded body has such high-temperature mechanical characteristics that even when the molecularly oriented molded body is heat-treated at 170° C. for 5 minutes, the strength or elastic modulus is hardly reduced or is improved conversely. It also was found that this molecularly oriented molded body has a prominently improved creep resistance while it retains high strength and high elastic modulus inherent to a draw-molded body of ultra-high-molecular-weight polyethylene.

More specifically, in accordance with the present invention, there is provided a molecularly oriented molded body of an ultra-high-molecular-weight ethylene/ polyene copolymer having an intrinsic viscosity $(\eta)$ of at least 5 dl/g and such a content of a polyene that the number of molecules of the polyene is 0.01 to 15 on the average per 1000 carbon atoms, wherein the molded body shows at least two crystal fusion endothermic peaks when the measurement is conducted in the restraint state by using a differential scanning calorimeter, the molded body has at least one crystal fusion endothermic peak (Tp) at a temperature higher by at least 20° C. than the inherent crystal fusion temperature (Tm) of the ultra-high-molecular-weight ethylene/polyene copolymer determined as the main fusion endothermic peak at the time of the second elevation of the temperature, and the quantity of heat based on said crystal fusion endothermic peak (Tp) is at least 15% based on the total fusion heat quantity.

DETAILED DESCRIPTION OF THE PREFERRED EMBODIMENTS

Figure 1:
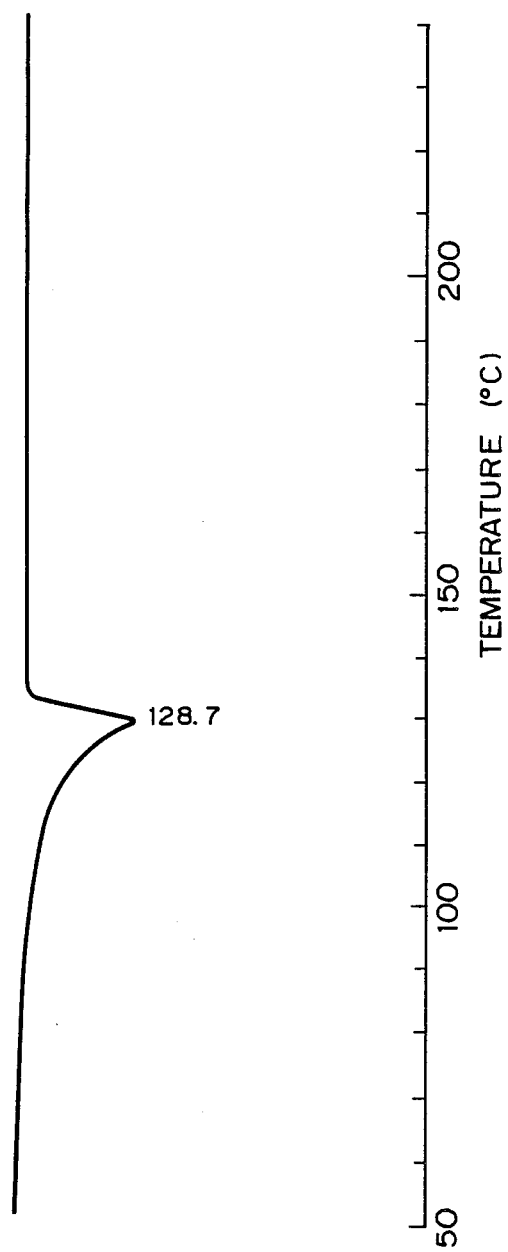
FIG. 1 shows an endothermic characteristic curve of a powder of an ultra-high-molecular-weight ethylene/polyene copolymer used in Example 1, determined by a differential scanning calorimeter.

The present invention is based on the surprising finding that when an ultra-high-molecular-weight ethylene/polyene copolymer formed by copolymerizing ethylene with a specific amount of a polyene is extrusion-molded and then strongly drawn to form a molecularly oriented molded body, the melting point of the polymer chain constituting the molecularly oriented molded body is elevated even under the restraint condition, as compared with a molecularly oriented molded body of an ultra-high-molecular-weight ethylene homopolymer.

Incidentally, the term "restraint state" or "restraint condition" used in the instant specification and appended claims means the state where no positive stretch is given to the molecularly oriented molded body but both the ends of the molded body are fixed so that free deformation is not allowed.

The melting point of a polymer is attributed to fusion of a crystal in the polymer and is generally measured as a temperature of an endothermic peak, caused by fusion of the crystal, by a differential scanning calorimeter. This endothermic peak temperature is constant in polymers of the same kind and is hardly changed by a post treatment such as a drawing treatment or a crosslinking treatment. Even by the drawing heat treatment known to cause a greatest change, the endothermic peak temperature is increased only by about 15"° C. at largest.

FIGS. 1, 2, 3 and 4 show endothermic curves, determined by a differential scanning calorimeter, of a starting ultra-high-molecular-weight ethylene/polyene copolymer used in the present invention, a highly drawn filament of this ethylene/polyene copolymer, ordinary starting ultra-high-molecular-weight polyethylene and a highly draw filament of this ultra-high-molecular-weight polyethylene, respectively. The endothermic curves of the highly drawn filaments are those determined under the restraint condition. Compositions of the respective polymers and the treatment conditions of the filaments are described in Examples given hereinafter. Incidentally, in determining endothermic curves of the starting polymers shown in FIGS. 1 and 3, the measurement was carried out according to the method of ASTM D-3418 in order to expel various histories of the polymerization. The composition of each polymer and the filament-treating conditions are illustrated in the examples given hereinafter.

From the results shown in FIGS. 1 through 4, it is understood that the drawn filament of the ordinary ultra-high-molecular-weight polyethylene shows an endothermic peak, attributed to the fusion of the crystal, at a temperature of about 150° C. higher by about 15° C. than the endothermic peak temperature of the starting ultra-high-molecular-weight polyethylene, whereas the drawn filament of the ultra-high-molecular-weight ethylene/polyene copolymer according to the present invention shows an endothermic peak at a temperature higher by at least about 20° C. than the endothermic peak temperature of the starting copolymer and the endothermic peak of the drawn filament of the copolymer is rendered multiplex as compared with the endothermic peak of the drawn filament of the ultra-high-molecular-weight homopolymer of ethylene.

Figure 2:
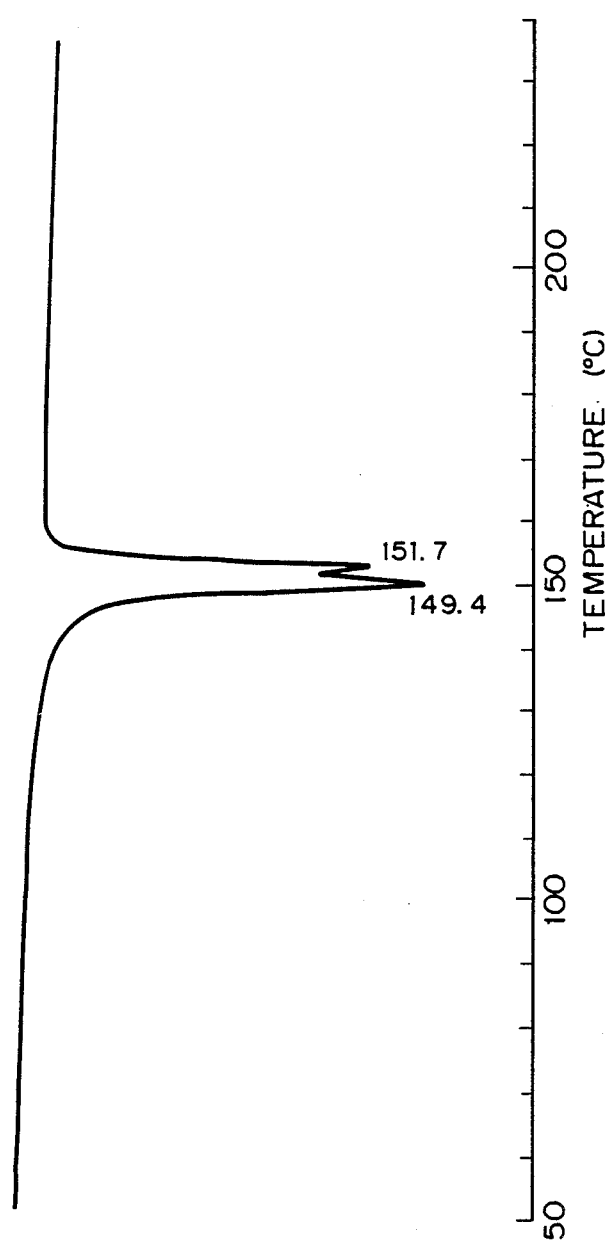
FIG. 2 shows an endothermic characteristic curve of a drawn and oriented fiber of the ultra-high-molecular-weight ethylene/polyene copolymer obtained in Example 1, determined by a differential scanning calorimeter in the restraint state.
Figure 3:
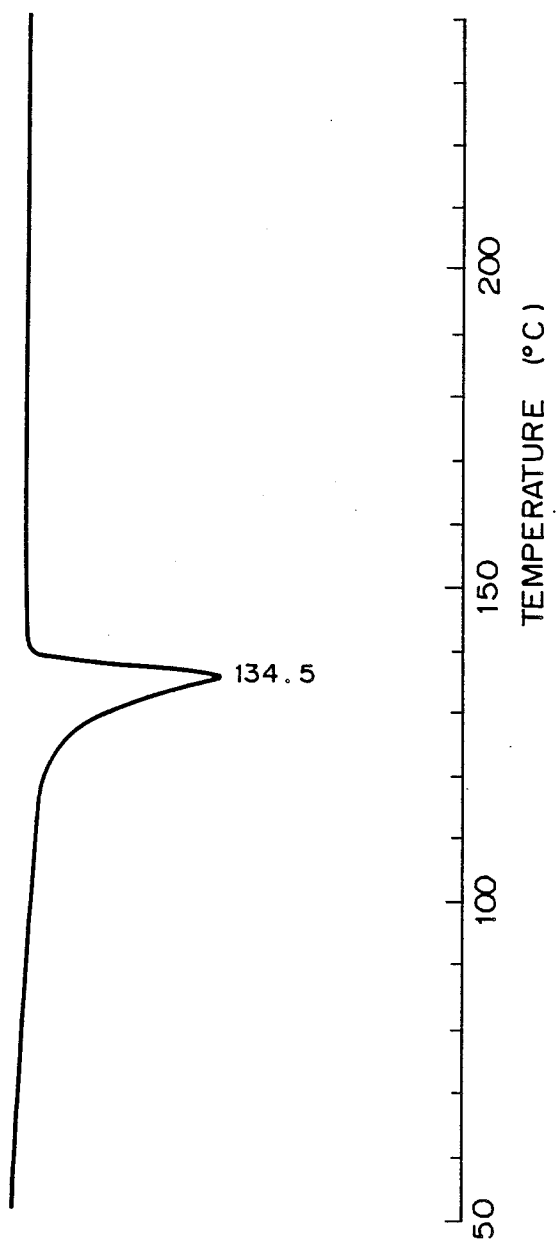
FIG. 3 shows an endothermic characteristic curve of a powder of ultra-high-molecular-weight polyethylene used in Comparative Example 1, determined by a differential scanning calorimeter.
Figure 5:
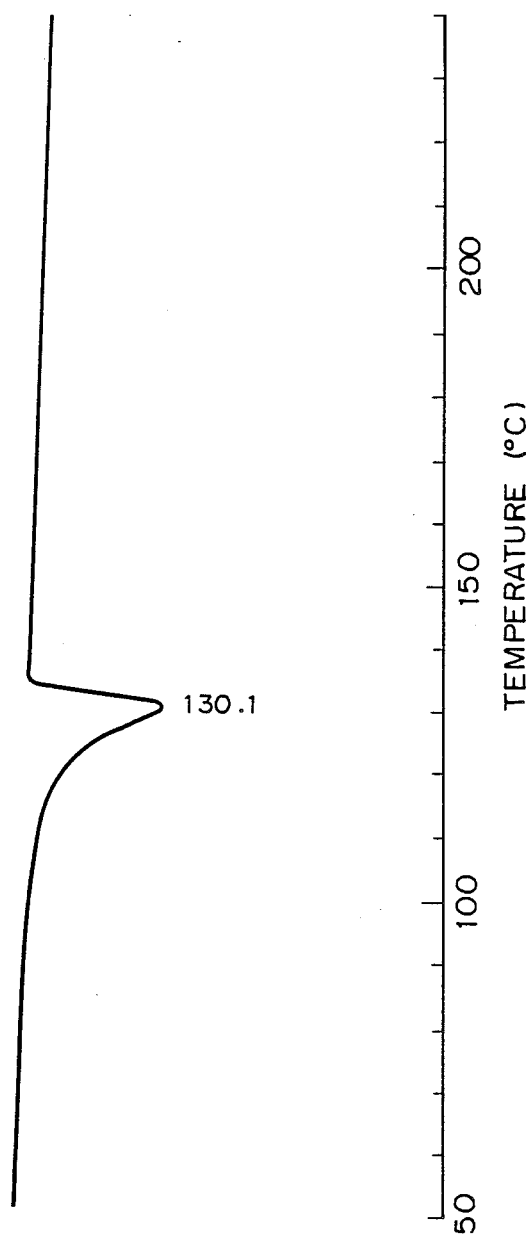
FIG. 5 shows an endothermic characteristic curve obtained when the sample shown in FIG. 2 is subjected to the second temperature elevation measurement (second run).

FIG. 5 shows an endothermic curve obtained when the sample shown in FIG. 2 is subjected to the second run (the second temperature elevation measurement conducted after the measurement of FIG. 2). From the results shown in FIG. 5, it is seen that at the second run, the main peak of the fusion of the crystal appears at substantially the same temperature as the temperature of the fusion peak of the starting ultra-high-molecular-weight ethylene/polyene copolymer and the molecular orientation in the sample substantially disappears at the measurement of the data of FIG. 5. Accordingly, it is understood that the change of the endothermic peak to the high temperature side in the sample of FIG. 2 has a close relation to the molecular orientation in the molded body.

Figure 4:
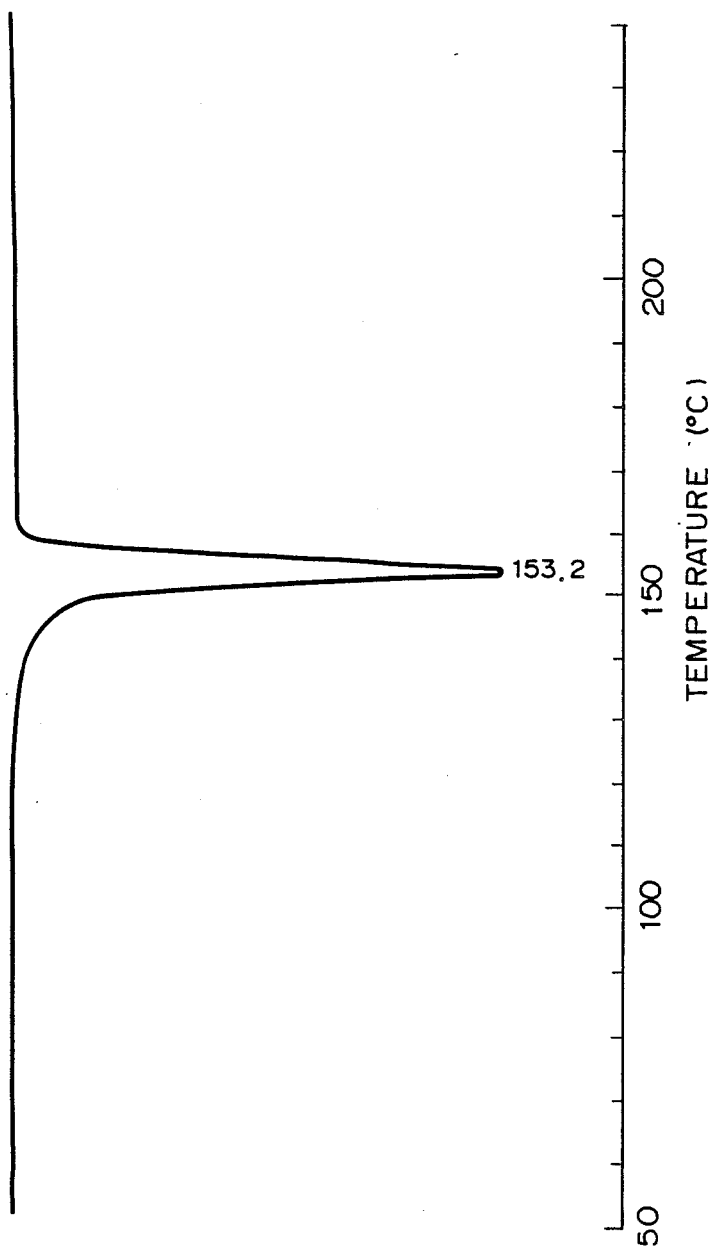
FIG. 4 shows an endothermic characteristic curve of a drawn and oriented fiber of the ultra-high-molecular-weight polyethylene obtained in Comparative Example 1, determined by a differential scanning calorimeter in the restraint state.

Moreover, from the comparison of FIG. 2 with FIG. 4, it is understood that the fact that the endothermic peak in the sample of FIG. 2 is rendered multiplex has a close relation to the presence of a branched chain formed by inclusion of a small amount of the polyene into the polymer chain.

In view of the ordinary fact that introduction of a comonomer component in a polymer chain results in reduction of the crystallinity and lowering of the melting point, it is quite surprising that in the molecularly oriented molded body of the present invention, by using a copolymer formed by copolymerizing ethylene with a small amount of a polyene, the melting point of the molecularly oriented molded body is maintained at a level equal to or higher than the melting point of the molecularly oriented molded body of ultra-high-molecular-weight polyethylene and, as described hereinafter, the creep resistance is highly improved.

The reason why the crystal fusion temperature is shifted to the high temperature side in the molecularly oriented molded body of the present invention and the drawability is enhanced by introduction of a small amount of a polyene comonomer has not been completely elucidated. However, if the above-mentioned measurement results are analyzed, it is presumed that this may be due to the following mechanism. Namely, in a molecularly oriented molded body of ultra-high-molecular-weight polyethylene, it is considered that many polymer chains pass through crystalline and amorphous zones alternately and are oriented in the drawing direction. In a molecularly oriented molded body of a copolymer formed by introducing a small amount of a polyene into this ultra-high-molecular-weight polyethylene by copolymerization, it is believed that the portion of the introduced polyene chain, that is, the portion where the side chain is formed, is selectively rendered amorphous, and the portion of the repeated ethylene chains becomes an oriented crystalline portion through this amorphous portion. In this case, since side chains introduced into the polymer chain in a number of 0.01 to 15 on the average per 1000 carbon atoms are concentrated in the amorphous portion, the orientation crystallization of the repeated ethylene chains is regularly advanced to a larger size or entanglement of the molecule chains is increased in the amorphous portions on both the ends of the oriented crystalline portion, with the result that the polymer chain becomes immobile and the melting point of the oriented crystalline portion rises.

The molecularly oriented molded body of the present invention is characterized in that even when the molded body is heat-treated at 170° C. for 5 minutes, the strength or the elastic modulus is not substantially reduced from the strength or the elastic modulus of the untreated molded body but the strength or the elastic modulus is rather improved over that of the untreated molded body. Moreover, this molecularly oriented molded body is prominently excellent in the creep resistance at high temperatures, and the creep ($CR_{90}$) determined according to the method described is less than $\frac{1}{2}$, especially less than $\frac{1}{66}$, of that of an oriented molded body of ordinary ultra-high-molecular-weight polyethylene and the creep speed $\epsilon_{90\text{-}180}$ (sec.$^{-1}$) is lower by at least one figure than that of the oriented molded body of ordinary ultra-high-molecular-weight polyethylene. It is deemed that such prominent improvements of the characteristics are due to the above-mentioned novel micro-structure of the oriented crystalline portion.

It is important that the ethylene/polyene copolymer used for the molecularly oriented molded body of the present invention should contain a polyene in such an amount that the number of polyene molecules is 0.01 to 15, especially 0.05 to 10, on the average per 1000 carbon atoms. Namely, the ultra-high-molecular-weight ethylene copolymer comprising a polyene as the comonomer is advantageous over ultra-high-molecular-weight polyethylene in that drawing is possible at a high draw ratio, and since drawing at a high draw ratio is possible, the elastic modulus and tensile strength can be further improved. It also is important that the polyene should be contained in the above-mentioned amount. If the content is below the above-mentioned range, the effect of increasing the crystal fusion temperature by the molecular orientation is not substantially attained, and if the content exceeds the above-mentioned range, the melting point of the ethylene/polyene copolymer is liable to lower and the effect of the crystal fusion temperature by the molecular orientation and the improvement of the elastic modulus are reduced.

In view of the mechanical characteristics and heat resistance of the molecularly oriented molded body, it is important that the intrinsic viscosity ($\eta$) of the ethylene/polyene copolymer should be at least 5 dl/g, especially 7 to 30 dl/g. Since the ends of the molecular chain make no contribution to the strength of the fiber and the number of the ends of the molecular chain is a reciprocal number of the molecular weight (viscosity), it is understood that a copolymer having a high intrinsic viscosity ($\eta$) gives a high strength.

In view of the heat resistance, that is, the strength or elastic modulus retention ratio at a high temperature or the creep resistance at a high temperature, it is important that the molecularly oriented molded body of the present invention should have at least one crystal fusion endothermic peak (Tp) at a temperature higher by at least 20° C. than the inherent crystal fusion temperature (Tm) of the ultra-high-molecular-weight ethylene/polyene copolymer determined as the main fusion endothermic peak at the time of the second elevation of the temperature, and that the quantity of heat based on this crystal fusion endothermic peak (Tp) should be at least 15%, preferably at least 20%, especially preferably at least 30%, based on the total fusion heat quantity.

Namely, a molecularly oriented molded body having no crystal fusion endothermic peak (Tp) at a temperature higher by at least 20° C. than Tm or a molecularly oriented molded body which has a crystal fusion endothermic peak at a temperature higher by at least 20° C. than Tm but in which the endothermic heat quantity based on this peak is smaller than 15% based on the total fusion heat quantity has such a tendency that the strength retention ratio or elastic modulus retention ratio is substantially reduced when the heat treatment is carried out at 170° C. for 5 minutes and the creep or the creep speed is increased at the time of heating.

For better illustration of the present invention, the starting material, the preparation process and the intended product will now be described successively.

Starting Material

The ultra-high-molecular-weight ethylene/polyene copolymer is obtained, for example, by slurry-polymerizing ethylene and a polyene as the comonomer in an organic solvent in the presence of a catalyst composed of a compound of a transition metal of the group IVb, Vb, VIb or VIII of the periodic table, a hydride of a metal of the group I, II or III of the periodic table or an organic metal compound. The polyene comonomer should be used in such an amount that the polyene content per 1000 carbon atoms in the polymer chain is within the above-mentioned range. Moreover, the ultra-high-molecular-weight ethylene/polyene copolymer should have a molecular weight corresponding to the above-mentioned intrinsic viscosity ($\eta$).

If the polyene content is smaller than 0.01 polyene molecule per 1000 carbon atoms, a structure effective for improving the creep resistance cannot be formed. On the contrary, if the polyene content exceeds 15 polyene molecules per 1000 carbon atoms, the crystallinity is drastically reduced and a high elastic modulus cannot be obtained.

The polyene compound used in the present invention is a hydrocarbon compound having in the molecule at least two unsaturated bonds, preferably double bonds. For example, there can be mentioned conjugated diene type hydrocarbon compounds such as 1,3-butadiene, 2-methyl-2,4-pentadiene, 2,3-dimethyl-1,3-butadiene, 2,4-hexadiene, 3-methyl-2,4-hexadiene, 1,3-pentadiene and 2-methyl-1,3-butadiene, non-conjugated diene type hydrocarbon compounds such as 1,4-pentadiene, 1,5-hexadiene, 1,6-heptadiene, 1,7-octadiene, 2,5-dimethyl-1,5-hexadiene, 4-methyl-1,4-hexadiene, 5-methyl-1,4-hexadiene, 4-ethyl-1,4-hexadiene, 4,5-dimethyl-1,4-hexadiene, 4-methyl-1.4-heptadiene. 4-ethyl-1,4-heptadiene, 5-methyl-1,4-heptadiene, 4-ethyl-1,4-octadiene, 5-methyl-1,4-octadiene and 4-n-propyl-1,4-decadiene, conjugated polyolefin type hydrocarbon compounds such as 1,3,5-hexatriene, 1,3,5,7-octatetraene and 2-vinyl-1,3-butadiene, non-conjugated polyolefin type hydrocarbon compounds such as squalene, and divinylbenzene and vinylnorbornene. Among them, non-conjugated diene type hydrocarbon compounds having an especially excellent copolymerizability with ethylene are preferred. The polyene has 5 to 20 carbon atoms, preferably 5 to 15 carbon atoms.

In the ultra-high-molecular-weight ethylene/polyene copolymer of the present invention, the determination of the polyene component is carried out by using an infrared spectrophotometer. Namely, the absorbances at 880 cm$^{-1}$, 910 cm$^{-1}$ and 965 cm$^{-1}$, which indicate the double bonds in the polyene structure included in the ethylene chain, are measured, and the measured values are converted to the number of the methyl branches per 1000 carbon atoms by using a calibration curve prepared in advance by using a model compound in a $^{13}$C nuclear magnetic resonance spectroscopy. Of course, it is obvious that the sum of the converted values of the peaks, which differ according to the structure of the introduced polyene, indicate the total polyene content.

Preparation Process

In order to make melt-molding of the ultra-high-molecular-weight ethylene/polyene copolymer possible, a diluent is incorporated in the above-mentioned components. A solvent for the ultra-high-molecular-weight ethylene copolymer or a wax having a compatibility with the ultra-high-molecular-weight ethylene copolymer is used as the diluent.

A solvent having a boiling point higher, especially by at least 20° C., than the melting point of the above-mentioned copolymer is preferably used as the solvent.

As specific examples of the solvent, there can be mentioned aliphatic hydrocarbon solvents such as n-nonane, n-decane, n-undecane, n-dodecane, n-tetradecane, n-octadecane, liquid paraffin and kerosine, aromatic hydrocarbon solvents and hydrogenation products thereof such as xylene, naphthalene, tetralin, butylbenzene, p-cymene, cyclohexylbenzene, diethylbenzene, benzylbenzene, dodecylbenzene, bicylohexyl, decalin, methylnaphthalene and ethylnaphthalene, halogenated hydrocarbon solvents such as 1,1,2,2-tetrachloroethane, pentachloroethane, hexachloroethane, 1,2,3-trichloropropane, dichlorobenzene, 1,2,4-trichlorobenzene and bromobenzene, and mineral oils such as paraffinic process oil, naphthenic process oil and aromatic process oil.

Aliphatic hydrocarbon compounds and derivatives thereof can be used as the wax.

A so-called paraffin wax composed mainly of a saturated aliphatic hydrocarbon compound having a molecular weight lower than 2000, preferably lower than 1000, especially preferably lower than 800, is mentioned as the aliphatic hydrocarbon compound. As specific examples of the aliphatic hydrocarbon compound, there can be mentioned n-alkanes having at least 22 carbon atoms, such as docosane, tricosane, tetracosane and triacontane, mixtures comprising an n-alkane as mentioned above as the main component and a lower n-alkane, so-called paraffin waxes separated and purified from petroleum, medium-pressure, low-pressure and high-pressure polyethylene waxes and ethylene copolymer waxes, which are low-molecular-weight polymers obtained by homopolymerizing ethylene or copolymerizing ethylene with other α-olefin, waxes formed by reducing the molecular weight of polyethylene such as medium-pressure, low-pressure or high-pressure polyethylene by thermal degradation, and oxidized waxes and maleic acid-modified waxes obtained by oxidizing the foregoing waxes or modifying the foregoing waxes with maleic acid.

As the aliphatic hydrocarbon compound derivative, there can be mentioned, for example, fatty acids, aliphatic alcohols, fatty acid amides, fatty acid esters, aliphatic mercaptans, aliphatic aldehydes and aliphatic ketons having at least 8 carbon atoms, preferably 12 to 50 carbon atoms, and a molecular weight of 130 to 2000, preferably 200 to 800, in which at least one, preferably 1 or 2, especially preferably one, of a functional group such as a carboxyl group, a hydroxyl group, a carbamoyl group, an ester group, a mercapto group or a carbonyl group is contained at the end or in the interior of an aliphatic hydrocarbon group such as an alkyl group or an alkenyl group.

As specific examples, there can be mentioned fatty acids such as capric acid, lauric acid, myristic acid, palmitic acid, stearic acid and oleic acid, aliphatic alcohols such as lauryl alcohol, myristyl alcohol, cetyl alcohol and stearyl alcohol, fatty acid amides such as capric amide, lauric amide, palmitic amide and stearyl amide, and fatty acid esters such as stearyl acetate.

The ultra-high-molecular-weight ethylene copolymer/diluent mixing ratio varies according to the kinds of these components, but it is generally preferred that this mixing ratio be from 15/85 to 80/20, especially from 25/75 to 60/40. If the amount of the diluent is too small and below the above-mentioned range, the melt viscosity becomes too high and melt kneading or melt molding is difficult, and surface roughening of the molded body is conspicuous and breaking is often caused at the drawing step. If the amount of the diluent is too large and exceeds the above-mentioned range, melt-kneading becomes difficult and the drawability of the molded body is insufficient.

It is generally preferred that melt kneading be carried out at 150° to 300° C., especially 170° to 270° C. If melt kneading is carried out at a lower temperature, the melt viscosity is too high and melt molding becomes difficult. If the temperature is too high and exceeds the above-mentioned range, the molecular weight of the ultra-high-molecular-weight ethylene copolymer is reduced by thermal degradation and it becomes difficult to obtain a molded body having high elastic modulus and high strength. Mixing can be performed by dry blending using a Henschel mixer or a V-blender or by melt mixing using a single screw or multi-screw extruder.

Melt molding is generally performed by melt extrusion molding. For example, a filament to be drawn is obtained by melt extrusion through a spinneret, or a film, sheet or tape to be drawn is obtained by extrusion through a flat die or ring die. Furthermore, a pipe (parison) for draw-blow forming is obtained by extrusion through a circular die. The present invention is especially valuable for the production of a drawn filament. In this case, the melt extruded from the spinneret can be drafted, that is, stretched in the molten state. The draft ratio can be defined by the following formula:

draft ratio = $V/V_o$ wherein $V_o$ stands for the extrusion speed of the molten resin in a die orifice, and V stands for the winding speed of the cooled and solidified undrawn filament.

The draft ratio depends on the temperature of the mixture and the molecular weight of the ultra-high-molecular-weight ethylene copolymer, but the draft ratio may be at least 3, preferably at least 6.

Of course, melt molding is not limited to extrusion molding, and in the production of various draw-formed vessels, a preform for draw-blow forming can be prepared by injection molding. Cooling solidification of the molded body can be accomplished by forced cooling means such as air cooling or water cooling.

The so-obtained undrawn molded body of the ultra-high-molecular-weight ethylene copolymer is subjected to a drawing treatment. Of course, the degree of the drawing treatment is such that molecular orientation in at least one axial direction can be effectively imparted to the ultra-high-molecular-weight ethylene copolymer of the molded body.

It is generally preferred that drawing of the molded body of the ultra-high-molecular-weight ethylene copolymer be carried out at a temperature of 40° to 160° C., preferably 80° to 145° C. Any of air, water steam and liquid media can be used as the heating medium for heating and maintaining the undrawn molded body at the above-mentioned temperature. If a solvent capable of eluting and removing the above-mentioned diluent, which has a boiling point higher than the melting point of the composition of the molded body, for example, decalin, decane, kerosine or the like, is used as the heating medium for the drawing operation, removal of the above-mentioned diluent becomes possible, and drawing unevenness can be eliminated at the drawing step and a high draw ratio can be attained.

Of course, the means for removing the excessive diluent from the ultra-high-molecular-weight ethylene copolymer is not limited to the above-mentioned method. For example, there may be adopted a method in which the undrawn molded body is treated with a solvent such as hexane, heptane, hot ethanol, chloroform or benzene and the undrawn molded body is then drawn, and a method in which the drawn molded body is treated with a solvent such as hexane, heptane, hot ethanol, chloroform or benzene. According to these methods, the excessive diluent can be effectively removed and a drawn product having a high elastic modulus and a high strength can be obtained.

The drawing operation may be carried out in one stage or a plurality of stages. The draw ratio depends on the desired molecular orientation and the resulting improvement of the fusion temperature, but in general, satisfactory results are obtained if the drawing operation is carried out at a draw ratio of 5 to 80, especially 10 to 50.

In general, drawing in a plurality of stages is advantageous, and there is preferably adopted a method in which at the first stage, the drawing operation is carried out at a relatively low temperature of 80° to 120° C. while extracting the diluent from the extrusionmolded body and at the second and subsequent stages, the operation of drawing the molded body is conducted at a temperature of 120° to 160° C., which is higher than the drawing temperature adopted at the first stage. Uniaxial drawing of a filament or tape is accomplished by performing the drawing operation between rollers differing in the peripheral speed, and a biaxially drawn film is obtained by performing stretch-drawing in the longitudinal direction between rollers differing in the longitudinal direction while performing stretch-drawing in the lateral direction by a tenter or the like. Biaxial drawing can also be performed by the inflation method. A three-dimensional biaxially draw-molded body such as a vessel can be obtained by combination of stretch-drawing in the axial direction and expansion-drawing in the circumferential direction.

The so-obtained molecularly oriented molded body can be heat-treated under a restraint condition, if desired. This heat treatment is carried out at a temperature of 140° to 180° C., especially 150° to 175° C., for 1 to 20 minutes, especially 3 to 10 minutes. By this heat treatment, crystallization of the oriented crystalline portion is further advanced, and the crystal fusion temperature is shifted to the high temperature side, the strength and elastic modulus are improved and the creep resistance at high temperatures is improved.

Molecularly Oriented Molded Body

As pointed out hereinbefore, the molecularly oriented molded body of the ultra-high-molecular-weight ethylene/polyene copolymer is characterized in that the molded body has at least one crystal fusion peak (Tp) at a temperature higher by at least 20° C. than the inherent crystal fusion temperature (Tm) of the above-mentioned copolymer and the fusion heat quantity based on the crystal fusion peak (Tp) is at least 15%, preferably at least 20%, especially preferably at least 30%, based on the total fusion heat quantity.

The inherent crystal fusion temperature (Tm) of the ultra-high-molecular-weight ethylene copolymer can be determined by the so-called second run in a differential scanning calorimeter, that is, according to the method in which the molded body of the ethylene copolymer is once fused completely and is then cooled to moderate the molecular orientation and the temperature is elevated again.

More specifically, in the molecularly oriented molded body of the present invention, any crystal fusion peak is not present in the above-mentioned inherent crystal fusion temperature range of the copolymer, or even if a peak is observed in this temperature range, the peak is present only as tailing or shoulder. The crystal fusion peak (Tp) appears ordinarily in the temperature range of from Tm+20° C. to Tm+50° C. It often happens that this peak (Tp) appears in the form of a plurality of peaks in the above-mentioned temperature range.

It is considered that the high crystal fusion peak (Tp) prominently improves the heat resistance of the molded body of the ultra-high-molecular-weight ethylene/polyene copolymer and makes contributions to maintenance of the strength retention ratio or elastic modulus retention ratio at a high level after the heat history at a high temperature.

In the present invention, the melting point and crystal fusion quantity were determined according to the following method.

The melting point was measured by using a differential scanning calorimeter (Model DSC II supplied by Perkin-Elmer Co.), and about 3 mg of a sample was kept in the restraint state by winding the sample on an aluminum sheet having a size of 4 mm×4 mm×0.2 mm (thickness). Then, the sample wound on the aluminum sheet was sealed in an aluminum pan to prepare a sample for the measurement. An aluminum sheet equal to that used for the sample was sealed in an aluminum pan ordinarily kept vacant, to be placed in a reference holder, and a heat balance was kept. At first, the sample was held at 30° C. for about 1 minute, and then, the temperature was elevated to 250° C. at a rate of 10° C./min and the measurement of the melting point at the first temperature elevation was completed. Subsequently, the sample was held at 250° C. for 10 minutes. Then, the temperature was lowered at a rate of 20° C./min and the sample was held at 30° C. for 10 minutes. Then, the temperature was elevated to 250° C. again at a rate of 10° C./min, and the measurement of the melting point at the second temperature elevation (second run) was completed. The maximum value of the fusion peak was designated as the melting point. When the peak appeared as the shoulder, tangential lines were drawn on the bending points on the low temperature side and high temperature side just close to the shoulder, and the intersection point was designated as the melting point.

A base line connecting points of 60° C. and 240° C. in the endothermic curve was drawn, and a perpendicular was drawn at the point higher by about 20° C. than the inherent crystal fusion temperature (Tm) of the ultra-high-molecular-weight ethylene copolymer determined as the main fusion peak at the second temperature elevation. The low temperature portion surrounded by these lines was regarded as being based on the inherent crystal fusion (Tm) and the high temperature portion was regarded as being based on the crystal fusion (Tp) manifesting the functions of the molded body of the present invention. The crystal fusion heat quantities were calculated from areas of these portions.

The degree of molecular orientation in the molded body can be determined by the X-ray diffraction method, the birefringence method or the fluorescence polarization method. In case of a drawn filament of the ultra-high-molecular-weight ethylene copolymer according to the present invention, from the mechanical properties, it is preferred that the orientation degree by the half-value width described in detail, for example, in Yukichi Go and Kiichiro Kubo; Kogyo Kagaku Zasshi, 39, 992 (1939), that is, the orientation degree (F) defined by the following formula;

$$\text{orientation degree (F.)} = \frac{90° - H°/2}{90°}$$

wherein H° stands for the half-value width (°) of the strength distribution curve along the Debye ring on the strongest paratroop on the equator line, be at least 0.90, especially at least 0.95.

When the drawn filament of the ultra-high-molecular-weight ethylene/polyene copolymer is subjected to a heat history at 170° C. for 5 minutes, the strength retention ratio is at least 90%, especially at least 95%, and the elastic modulus retention ratio is at least 90%, especially at least 95%. Namely, the drawn filament has an excellent heat resistance not attainable in conventional drawn filaments of polyethylene.

Furthermore, this drawn filament is especially excellent in the creep resistance characteristics at high temperatures. Namely, the creep determined as the elongation (%) when the filament is maintained under a load corresponding to 30% of the breaking load at an ambient temperature of 70° C. for 90 seconds is lower than 7%, especially lower than 5%, and the creep speed ($\epsilon$, $\sec^{-1}$) between the point of 90 seconds and the point of 180 seconds is lower than $4 \times 10^{-4} \sec^{-1}$, especially lower than $2 \times 10^{-4} \sec^{-1}$.

Moreover, the molecularly oriented molded body of the ultra-high-molecular-weight ethylene/polymer copolymer according to the present invention is excellent in mechanical properties. For example, the molded body in the form of a drawn filament has an elastic modulus of at least 20 GPa, especially at least 30 GPa, and a tensile strength of at least 1.2 GPa, especially at least 1.5 GPa.

The molecularly oriented molded body of the ultra-high-molecular-weight ethylene/polymer copolymer according to the present invention is excellent in the combination of heat resistance, creep resistance and mechanical properties, and by utilizing these characteristics, the molecularly oriented molded body of the present invention can be valuably used as industrial textile materials such as high-tenacity multi-filaments, strings, ropes, woven fabrics and non-woven fabrics, and packaging materials such as packaging tapes.

When the molded body in the form of a filament is used as a reinforcing fiber for various resins such as epoxy resins and unsaturated polyesters and synthetic rubbers, as will be readily understood, the heat resistance and creep resistance are highly improved over those attained by a drawn filament of the conventional ultra-high-molecular-weight polyethylene. Furthermore, since this filament has a high strength and a low density, a high weight-reducing effect is advantageously attained, as compared with molded bodies formed by using conventional glass fibers, carbon fibers, boron fibers, aromatic polyamide fibers and aromatic polyimide fibers. As in case of composite materials formed by using glass fibers or the like, a composite material comprising the drawn filament of the present invention will be effectively used for the production of UD (unit directional) laminated boards, SMC (sheet molding compounds) and BMC (bulk molding compounds) and will be used in the fields where reduction of the weight and increase of the strength are required, for example, for the production of automobile parts, structural bodies such as boats and yachts and boards for electronic circuits.

The present invention will now be described in detail with reference to the following examples that by no means limit the scope of the invention.

Example 1

(Polymerization for Preparation of Ultra-High-Molecular-Weight Ethylene/Polyene Copolymer)

Polymerization for formation of an ultra-high-molecular-weight ethylene/1,5-hexadiene copolymer was carried out in 1 l of n-decane as the polymerization solvent in the presence of a Ziegler catalyst. At the start of the polymerization, 25 ml of 1,5-hexadiene was added to the solvent. Then, ethylene was supplied in a polymerization vessel so that the polymerization pressure was maintained at 5 kg/cm$^2$, while maintaining the temperature of the reaction mixture at 70° C. The polymerization was conducted for about 2 hours while appropriately adding hydrogen as the chain transfer agent in an amount of 30 ml as a whole. The amount of the obtained powdery ultra-high-molecular-weight ethylene/1,5-hexadiene copolymer was 205 g, the intrinsic viscosity (at 135° C. in decalin) of the copolymer was 8.72 dl/g, and the 1,5-hexadiene content determined by an infrared spectrophotometer was 0.06 1,5-hexadiene molecule per 1000 carbon atoms.

(Preparation of Drawn and Oriented Product of Ultra-High-Molecular-Weight Ethylene/1,5-Hexadiene Copolymer)

A mixture comprising 20 parts by weight of the powdery ultra-high-molecular-weight ethylene/1,5-hexadiene copolymer obtained by the above-mentioned polymerization and 80 parts by weight of a paraffin wax (melting point=69° C., molecular weight=490) was melt-spun under the following conditions.

To 100 parts by weight of the above-mentioned mixture was added 0.1 part by weight of 3,5-di-tert-butyl-4-hydroxy-toluene as the process stabilizer, and the mixture was melt-kneaded at a set temperature of 175° C. by using a screw type extruder (screw diameter=25 mm, L/D=25, supplied by Thermoplastics Co.). Subsequently, the molten mixture was melt-spun through a spinning die having an orifice diameter of 2 mm, which was attached to the extruder. The extruded melt was taken at a draft ratio of 38 at an air gap of 180 cm and cooled and solidified in the air to obtain an undrawn fiber.

The undrawn fiber was drawn under the following conditions.

Two-staged drawing was carried out by using three godet rolls. The heating medium in a first drawing tank was n-decane and the temperature was 110° C., and the heating medium in a second drawing tank was triethylene glycol and the temperature was 145° C. The effective length of each tank was 50 cm. The rotation speed of the first godet roll was adjusted to 0.5 m/min and an oriented fiber having a desired draw ratio was obtained by adjusting the rotation speed of the third godet roll. The rotation speed of the second godet roll was selected so that stable drawing was possible. Substantially all of the paraffin wax initially added was extracted in n-decane at the drawing step. The oriented fiber was then washed with water and dried a whole day and night, and the physical properties were determined. Incidentally, the draw ratio was calculated from the ratio of the rotation speed between the first and third godet rolls.

(Measurement of Tensile Characteristics)

The elastic modulus and tensile strength were measured at room temperature (23° C.) by using a tensile tester (Model DCS-50M supplied by Shimazu Seisakusho).

The sample length between clamps was 100 mm, and the pulling speed was 100 mm/min (the distortion speed was 100%/min). The elastic modulus was the initial elastic modulus calculated by using the gradient of the tangential line. The sectional area of the fiber necessary for the calculation was calculated from the weight on the assumption that the density was 0.960 g/cc.

(Measurement of Creep Resistance)

The creep characteristics were measured by using a thermal stress distortion measurement apparatus (Model TMA/SS10 supplied by Seiko Denshi Kogyo), and the sample length was 1 cm and the ambient temperature was 70° C. The measurement was conducted under an accelerated condition by imposing a load corresponding to 30% of the breaking load at room temperature on the sample. In order to evaluate the creep quantity quantitatively, the following two values were determined. Namely, the creep elongation $CR_{90}$ (%) after 90 seconds from the point of imposition of the load and the average creep speed ($sec^{-1}$ between the point of 90 seconds from the imposition of the load and the point of 180 seconds from the imposition of the load were determined.

(Tensile Elastic Modulus and Strength Retention Ratios after Heat History)

The heat history test was carried out by allowing the sample to stand still in a gear oven (perfect oven supplied by Tabai Seisakusho).

The sample having a length of about 3 m was wound repeatedly on a stainless steel frame having a plurality of blocks attached to both the ends thereof, and both the ends of the sample were fixed to such an extent that the sample did not slacken and no positive tension was imposed on the sample. After the heat history test, the tensile characteristics were determined according to the above-mentioned procedures.

The tensile characteristics of the obtained drawn and oriented fiber are shown in Table 1.

TABLE 1

| Sample | Sample 1 |
| --- | --- |
| Fineness (denier) | 16.6 |
| Draw ratio | 12 |
| Strength (GPa) | 2.2 |
| Elastic modulus (GPa) | 48.5 |
| Elongation (%) | 5.4 |

Figure 7:
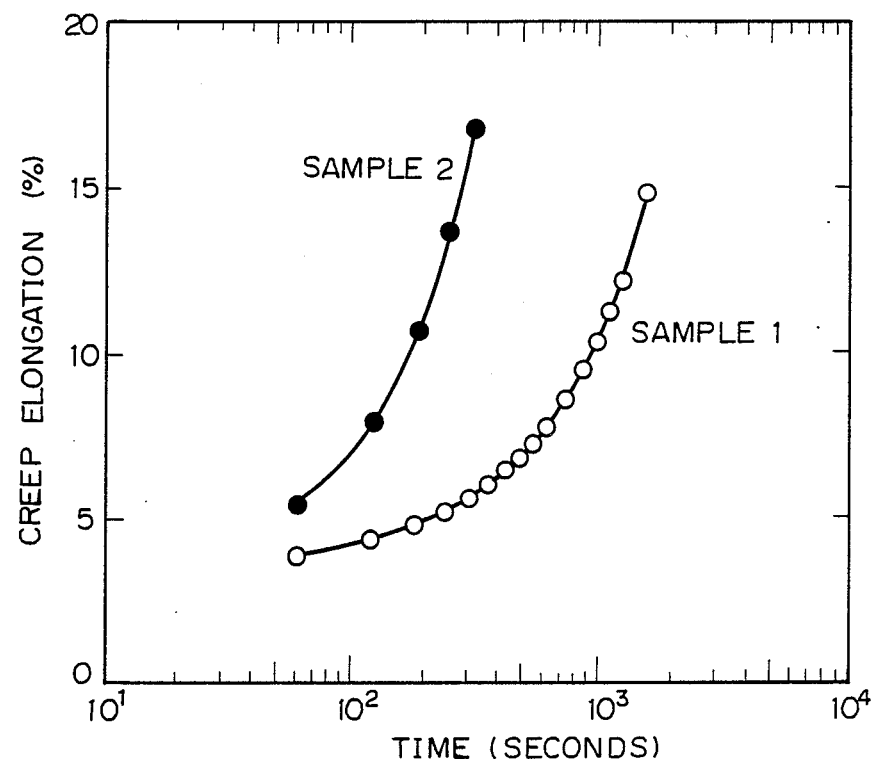
FIG. 7 shows creep characteristic curves of the drawn and oriented fibers of the polymers obtained in Example 1 and Comparative Example 1.

The endothermic characteristic curve of sample 1 at the first temperature elevation, determined by the differential scanning calorimeter, is shown in FIG. 2, and the endothermic characteristic curve at the second temperature elevation (second run) is shown FIG. 5. The inherent crystal fusion peak of the drawn and oriented fiber (sample 1) of the ultra-high-molecular-weight ethylene/1,5-hexadiene copolymer appeared at 130.1° C., and the proportion of Tp to the total crystal fusion peak area was 36.2%. The creep resistance characteristics were such that $CR_{90}$ was 3.86% and $\epsilon$ was $7.33 \times 10^{-5} sec^{-1}$. The creep characteristics of sample 1 are shown in FIG. 7. After the heat history at 170° C. for 5 minutes, the elastic modulus retention ratio was 109.3% and the strength retention ratio was 104.3%. Therefore, it was confirmed that the performances were not degraded by the heat history.

Comparative Example 1

A mixture comprising 20 parts by weight of powdery ultra-high-molecular-weight polyethylene (homopolymer) (the intrinsic viscosity ($\eta$) was 7.42 dl/g at 135° C. in decalin) and 80 parts by weight of a paraffin wax (the melting point was 69° C. and the molecular weight was 490) was melt-spun and drawn in the same manner as described in Example 1. The tensile characteristics of the obtained drawn and oriented fiber are shown in Table 2.

TABLE 2

| Sample | Sample 2 |
| --- | --- |
| Fineness (denier) | 9.3 |
| Draw ratio | 25 |
| Strength (GPa) | 2.53 |
| Elastic modulus (GPa) | 71.5 |
| Elongation (%) | 4.31 |

Figure 6:
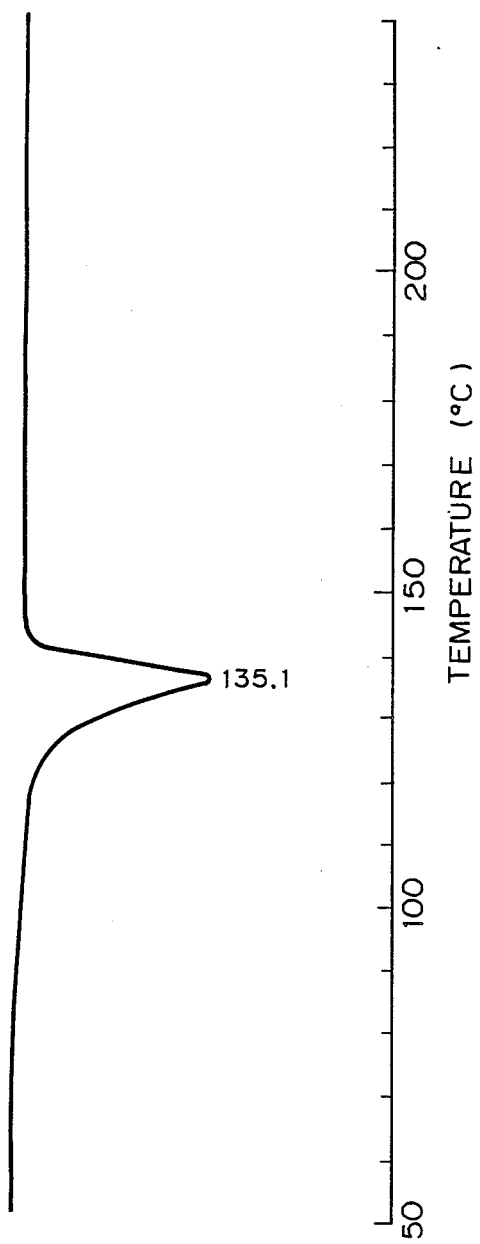
FIG. 6 shows an endothermic characteristic curve obtained when the sample shown in FIG. 4 is subjected to the second temperature elevation measurement.

The endothermic characteristic curve of the drawn and oriented fiber (sample 2) of the ultra-high-molecular-weight polyethylene at the first temperature elevation, determined by the differential scanning calorimeter, is shown in FIG. 4, and the endothermic characteristic curve at the second temperature elevation (second run) is shown in FIG. 6. The inherent crystal fusion peak temperature of the ultra-high-molecular-weight polyethylene of sample 2 was 135.1° C. and the proportion of Tp to the total crystal fusion peak area was 8.8%. The creep resistance characteristics were such that $CR_{90}$ was 12.0% and $\epsilon$ was $1.07 \times 10^{-5} sec^{-1}$. The creep characteristics of sample 2 are shown in FIG. 7 together with those of sample 1. After the heat history at 170° C. for 5 minutes, the elastic modulus retention ratio was 80.4% and the strength retention ratio was 79.2%. It was confirmed that the elastic modulus and strength were degraded by the heat history.

We claim:

1. A molecularly oriented molded body of an ultra-high-molecular-weight ethylene/polyene copolymer having an intrinsic viscosity ($\eta$) of at least 5 dl/g and such a content of a polyene that the number of molecules of the polyene is 0.01 to 15 on the average per 1000 carbon atoms, wherein the molded body shows at least two crystal fusion endothermic peaks when the measurement is conducted in the restraint state by using a differential scanning calorimeter, the molded body has at least one crystal fusion endothermic peak (Tp) at a temperature higher by at least 20° C. than the inherent crystal fusion temperature (Tm) of the ultra-high-molecular-weight ethylene/polyene copolymer determined as the main fusion endothermic peak at the time of the second elevation of the temperature, and the quantity of heat based on said crystal fusion endothermic peak (Tp) is at least 15% based on the total fusion heat quantity.

2. A molded body as set forth in claim 1, wherein the polyene is a non-conjugated diene type hydrocarbon having 5 to 20 carbon atoms.

3. A molded body as set forth in claim 1, wherein the content of the polyene is 0.05 to 10 polyene molecules per 1000 carbon atoms.

4. A molded body as set forth in claim 1, wherein the intrinsic viscosity ($\eta$) of the ethylene/polyene copolymer is 7 to 30 dl/g.

5. A molded body as set forth in claim 1, wherein the heat quantity based on the crystal fusion endothermic peak (Tp) is at least 30% based on the total fusion heat quantity.

6. A molecularly oriented molded body in the form of a filament of an ultra-high-molecular-weight ethylene/polyene copolymer having an intrinsic viscosity ($\eta$) of at least 5 dl/g and such a content of a polyene that the number of molecules of the polyene is 0.01 to 15 on the average per 1000 carbon atoms, wherein the molded body shows at least two crystal fusion endothermic peaks when the measurement is conducted in the restraint state by using a different scanning calorimeter, the molded body has at least one crystal fusion endothermic peak (Tp) at a temperature higher by at least 20° C. than the inherent crystal fusion temperature (Tm) of the ultra-high-molecular-weight ethylene/polyene copolymer determined as the main fusion endothermic peak at the time of the second elevation of the temperature, and the quantity of heat based on said crystal fusion endothermic peak (Tp) is at least 15% based on the total fusion heat quantity.

7. A molecularly oriented molded body of an ultra-high-molecular-weight ethylene/polyene copolymer having an intrinsic viscosity ($\eta$) of at least 5 dl/g and such a content of a polyene that the number of molecules of the polyene is 0.01 to 15 on the average per 1000 carbon atoms, wherein the molded body shows at least two crystal fusion endothermic peaks when the measurement is conducted in the restraint state by using a differential scanning calorimeter, the molded body has at least one crystal fusion endothermic peak (Tp) at a temperature higher by at least 20° C. than the inherent crystal fusion temperature (Tm) of the ultra-high-molecular-weight ethylene/polyene copolymer determined as the main fusion endothermic peak at the time of the second elevation of the temperature, and the quantity of heat based on said crystal fusion endothermic peak (Tp) is at least 15% based on the total fusion heat quantity, which is obtained by melt-kneading a composition comprising the ultra-high-molecular-weight ethylene/polyene copolymer and a diluent, extruding the melt in the form of a filament and drawing the obtained filament.

8. A molded body as set forth in claim 7, wherein the diluent is a wax.

9. A molecularly oriented and drawn filament of an ultra-high-molecular-weight ethylene/polyene copolymer having an intrinsic viscosity ($\eta$) of at least 5 dl/g and such a content of an polyene that the number of molecules of the polyene is 0.1 to 15 on the average per 1000 carbon atoms, wherein the filament shows at least two crystal fusion endothermic peaks when the measurement is conducted in the restraint state by using a differential scanning calorimeter, the filament has at least one crystal fusion endothermic peak (Tp) at a temperature higher by at least 20° C. than the inherent crystal fusion temperature (Tm) of the ultra-high-molecular-weight ethylene/polyene copolymer determined as the main fusion endothermic peak at the time of the second elevation of the temperature, the quantity of heat based on said crystal fusion endothermic peak (Tp) is at least 15% based on the total fusion heat quantity, the filament has an elastic modulus of at least 20 GPa and tensile strength of at least 1.2 GPa and when a heat history at 170° C. for 5 minutes is given to the filament, the elastic modulus retention ratio is at least 90% and the tensile strength retention ratio is at least 90%.

10. A drawn filament as set forth in claim 9, which has an orientation degree of at least 0.90.

11. A drawn filament as set forth in claim 9, wherein the polyene is 1,5-hexadiene.

* * * * *